United States Patent
Chen et al.

(10) Patent No.: US 9,681,573 B2
(45) Date of Patent: Jun. 13, 2017

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaosiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 126 days.

(21) Appl. No.: 14/508,023

(22) Filed: Oct. 7, 2014

(65) Prior Publication Data
US 2016/0097229 A1  Apr. 7, 2016

(51) Int. Cl.
E05D 15/08 (2006.01)
H05K 7/14 (2006.01)
A47B 88/40 (2017.01)

(52) U.S. Cl.
CPC ........ H05K 7/1489 (2013.01); A47B 88/40 (2017.01)

(58) Field of Classification Search
CPC ........ E05D 15/08; A47B 88/40; H05K 7/1489
USPC ........................................ 312/334.4; 16/94 R
See application file for complete search history.

(56) References Cited

U.S. PATENT DOCUMENTS

| | | | |
|---|---|---|---|
| 6,609,619 B2* | 8/2003 | Abbott | H05K 7/1421 211/26 |
| 7,357,362 B2 | 4/2008 | Yang et al. | |
| 7,364,244 B2* | 4/2008 | Sandoval | H05K 7/1411 312/333 |
| 8,033,621 B2* | 10/2011 | Liang | H05K 7/1489 312/334.4 |
| 8,079,654 B2* | 12/2011 | Yu | A47B 88/044 211/26 |
| 8,353,494 B2* | 1/2013 | Peng | A47B 88/044 211/192 |
| 8,371,454 B2 | 2/2013 | Chen et al. | |
| 8,403,434 B2* | 3/2013 | Yu | H05K 7/1489 248/244 |
| 8,931,860 B2* | 1/2015 | Fan | H05K 7/1489 248/222.12 |
| 9,148,976 B2* | 9/2015 | Fan | H05K 7/1489 |
| 9,237,808 B2* | 1/2016 | Chen | A47B 88/10 |
| 9,480,183 B2* | 10/2016 | Chen | H05K 7/183 |
| 2011/0290746 A1* | 12/2011 | Lu | H05K 7/1489 211/26 |

(Continued)

*Primary Examiner* — Daniel J Troy
*Assistant Examiner* — Ryan A Doyle
(74) *Attorney, Agent, or Firm* — Rosenberg, Klein & Lee

(57) ABSTRACT

A slide rail assembly includes first and second rails, a retaining member, and a bracket. The second rail is movable to a retracted position relative to the first rail. The retaining member is connected to the second rail. The bracket includes a side plate connected to the first rail, an end plate bent from the side plate, and a movable member movably connected to the side plate. The movable member has at least one retaining portion corresponding to the end plate. When the second rail is in the retracted position, at least a portion of the retaining member faces the movable member so that the second rail can, via the retaining member, restrict displacement of the movable member relative to the retaining member.

16 Claims, 9 Drawing Sheets

(56) References Cited

U.S. PATENT DOCUMENTS

2015/0201754 A1\* 7/2015 Chen .................... A47B 96/067
           248/219.3
2016/0029791 A1\* 2/2016 Chen ...................... H05K 7/183
           312/334.44

\* cited by examiner

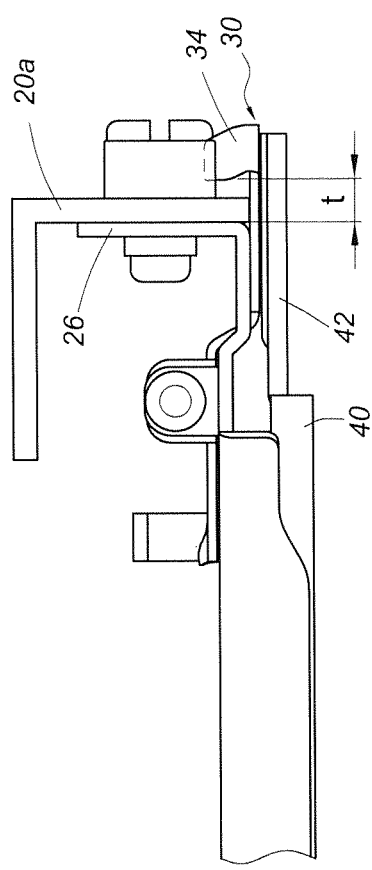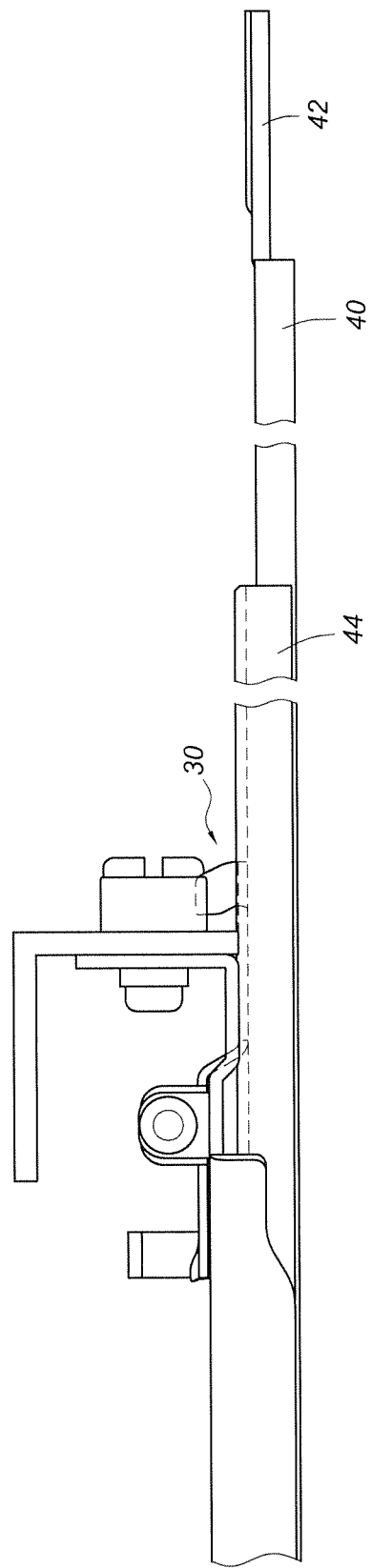

SLIDE RAIL ASSEMBLY

FIELD OF THE INVENTION

The present invention relates to a slide rail and, more particularly, to a slide rail assembly in which, by means of a retaining member, a second rail when retracted relative to a first rail can restrict displacement of the movable member of a bracket relative to the retaining member.

BACKGROUND OF THE INVENTION

In a slide rail system for use with servers, each of the two corresponding lateral sides of a server is mounted to a rack typically by a slide rail assembly and the two brackets mounted respectively at the two ends of the slide rail assembly. Generally, each bracket has at least one mounting member to be mounted to a corresponding mounting hole in the rack, and each of the front brackets has a movable member to be blocked by or fastened at the front end of the rack. The movable members are provided to keep the slide rail assemblies from falling off from the rack. The foregoing structure has been disclosed in, for example, U.S. Pat. No. 7,357,362 B2 and U.S. Pat. No. 8,371,454 B2, the disclosures of which are incorporated herein by reference.

According to the specification, FIG. 3, and FIG. 5 of the afore-cited '362 B2 patent, a slide rail assembly is mounted to a mounting hole (71) of a rack (7) via the mounting member (2) of a bracket (1), and the retaining portion (431) of a movable member (42) (see FIG. 5 of the '362 B2 patent) is configured to be blocked by or fastened at the front end of the rack (7) so as to prevent the slide rail assembly from falling off from the rack (7).

It can be known from the technical disclosures of the afore-cited US patents that the brackets in the prior art typically include a movable member with a retaining portion to be blocked by or fastened at the front end of a rack. However, existing products need improvement to ensure that the movable member stays in the predetermined working state or predetermined position.

SUMMARY OF THE INVENTION

The present invention relates to a slide rail assembly in which, when a second rail has been retracted relative to a first rail, a retaining member can restrict displacement of the movable member of a bracket relative to the retaining member.

According to one aspect of the present invention, a slide rail assembly includes a first rail, a second rail, a retaining member, and a bracket. The second rail can be displaced longitudinally to a retraced position relative to the first rail. The retaining member is connected to the second rail. The bracket includes a side plate, an end plate, and a movable member movably connected to the side plate. The side plate and the end plate are in a substantially perpendicular arrangement. The side plate is connected to the first rail. The movable member has at least one retaining portion corresponding to the end plate and spaced from the end plate by a predetermined distance. When the second rail is in the retracted position relative to the first rail, at least a portion of the retaining member faces the movable member so that the second rail can, via the retaining member, restrict lateral displacement of the movable member relative to the retaining member.

Preferably, the retaining member is integrally formed with the second rail.

Preferably, the retaining member is connected to the second rail by a connecting means.

Preferably, each of the retaining member and the second rail has an assembly portion allowing the retaining member and the second rail to connect with each other.

Preferably, the movable member is pivotally connected to the side plate by a connector.

According to another aspect of the present invention, a slide rail assembly is configured for mounting a chassis to a rack. The slide rail assembly is mounted to the rack via at least one bracket. The rack includes a hole. The bracket includes a side plate, an end plate, a mounting member connected to the end plate and mounted to the hole of the rack, and a movable member movably connected to the side plate. The side plate and the end plate are in a substantially perpendicular arrangement. The movable member has a retaining portion and can be moved to a closed position and an opened position. The retaining portion of the movable member is blocked by the rack when the movable member has been operated and thereby moved to the closed position. The slide rail assembly includes a first rail, a second rail, and a retaining member. The first rail is connected to the side plate of the bracket. The second rail can be displaced longitudinally relative to the first rail. The chassis is mounted to the second rail. The retaining member is provided at least one of the chassis and the second rail. When the second rail has been retracted relative to the first rail, the second rail can restrict, via the retaining member, movement of the movable member from the closed position to the opened position.

Preferably, the retaining member is integrally formed with the second rail.

Preferably, the retaining member is connected to the second rail by a connecting means.

Preferably, the retaining member and the second rail have corresponding assembly portions allowing the retaining member and the second rail to connect with each other.

Preferably, the movable member is pivotally connected to the side plate by a connector.

According to yet another aspect of the present invention, a slide rail assembly includes a first rail, a second rail, a retaining member, and a bracket. The second rail can be displaced longitudinally relative to the first rail. The retaining member is connected to the second rail. The bracket includes a side plate connected to the first rail, an end plate bent from the side plate, and a movable member movably connected to the side plate. The movable member has a retaining portion and can be moved to a closed position and an opened position. The retaining portion of the movable member corresponds to the end plate when the movable member has been operated and thereby moved to the closed position. When the second rail has been retracted relative to the first rail, the second rail can, via the retaining member, restrict movement of the movable member from the closed position to the opened position.

Preferably, the retaining member is integrally formed with the second rail.

Preferably, the retaining member is connected to the second rail by a connecting means.

Preferably, each of the retaining member and the second rail has an assembly portion allowing the retaining member and the second rail to connect with each other.

Preferably, the movable member is pivotally connected to the side plate by a connector.

One of the advantageous features of the present invention is that, once the second rail has been retracted relative to the first rail, the retaining member can restrict displacement of the movable member of the bracket relative to the retaining member.

BRIEF DESCRIPTION OF THE DRAWINGS

The invention as well as a preferred mode of use and the advantages thereof will be best understood by referring to the following detailed description of some illustrative embodiments in conjunction with the accompanying drawings, in which:

FIG. 6A is a schematic drawing in which the second rail of the slide rail assembly in the first embodiment of the present invention is in a retracted position relative to the first rail;

FIG. 6B is a schematic drawing in which the second rail of the slide rail assembly in the first embodiment of the present invention is in an extended position relative to the first rail;

DETAILED DESCRIPTION OF THE INVENTION

Figure 1:
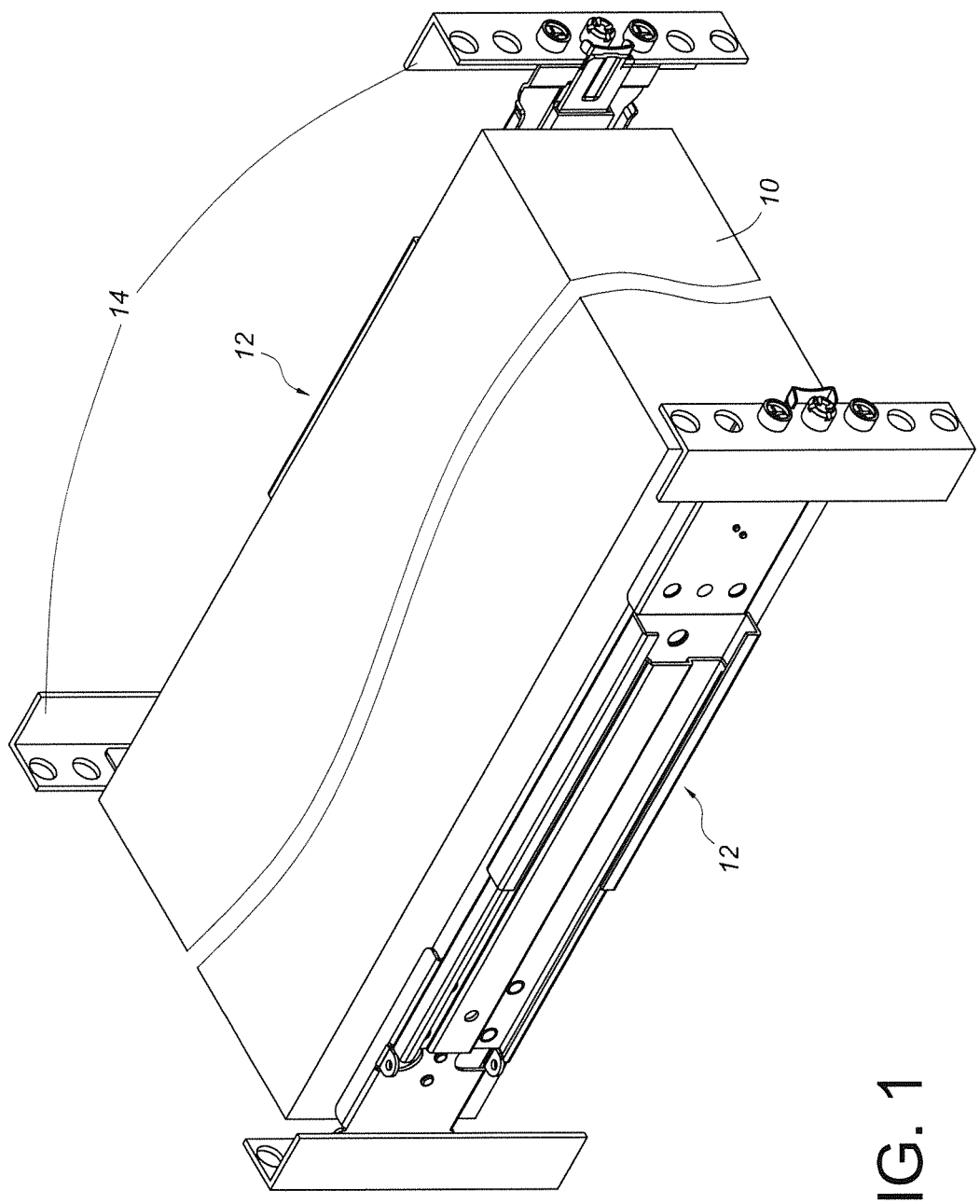
FIG. 1 is a perspective view showing how the slide rail assembly in the first embodiment of the present invention is applied to a server system.

FIG. 1 shows how the slide rail assembly in the first embodiment of the present invention is applied to a server system. The server system includes a server chassis 10 whose two corresponding lateral sides are mounted to a rack 14 by a pair of slide rail assemblies 12 respectively.

Figure 2:
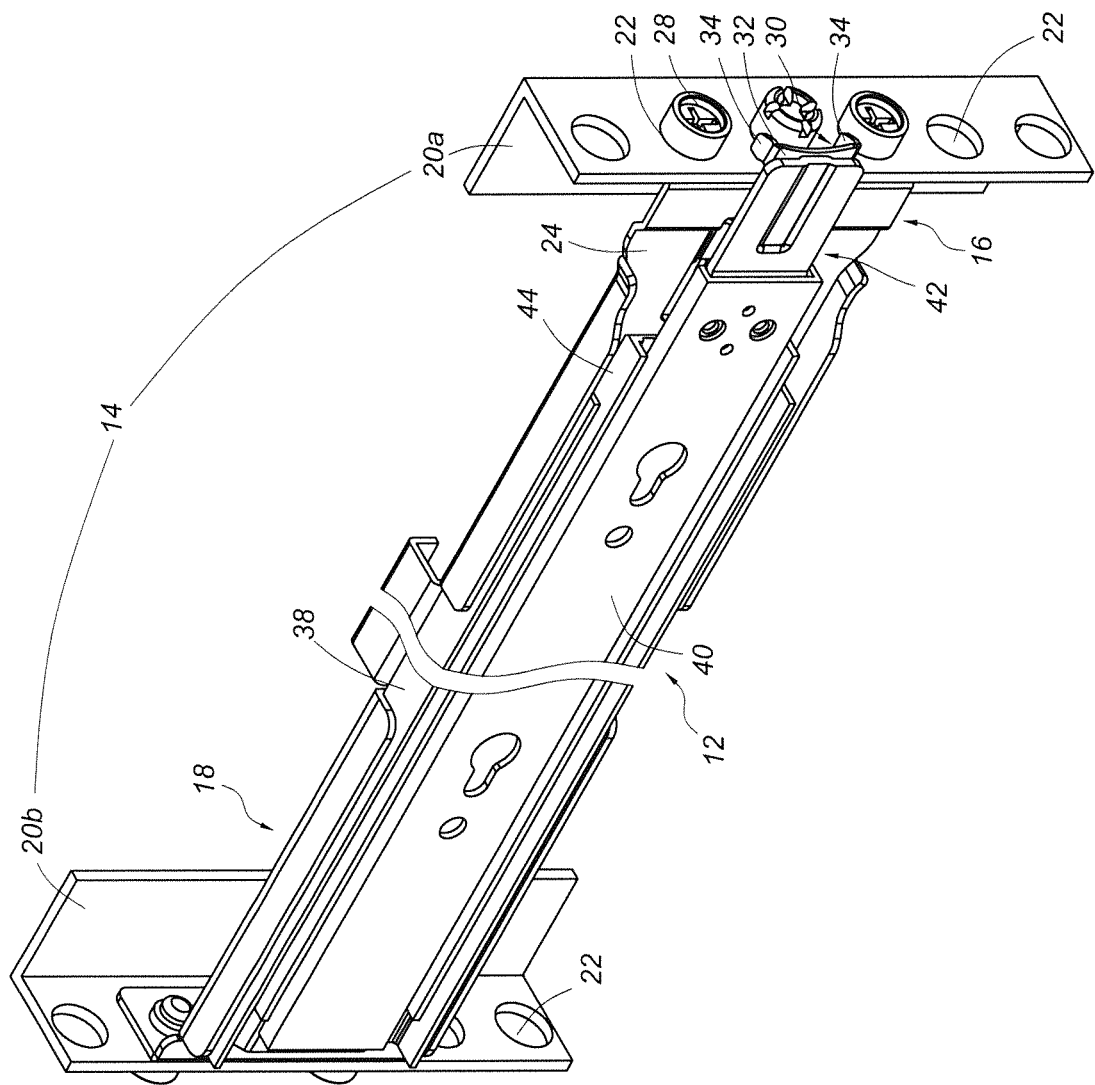
FIG. 2 is a perspective view showing how each slide rail assembly in FIG. 1 is mounted to a rack via brackets.

FIG. 2 shows how a first bracket 16 and a second bracket 18 are mounted to two opposite portions (e.g., a front portion and a rear portion) of each slide rail assembly 12 in FIG. 1 respectively. Through the first bracket 16 and the second bracket 18, the two opposite portions of the slide rail assembly 12 can be mounted to a first post 20a and a second post 20b of the rack 14 respectively. Each of the first post 20a and the second post 20b includes at least one hole 22.

Figure 3:
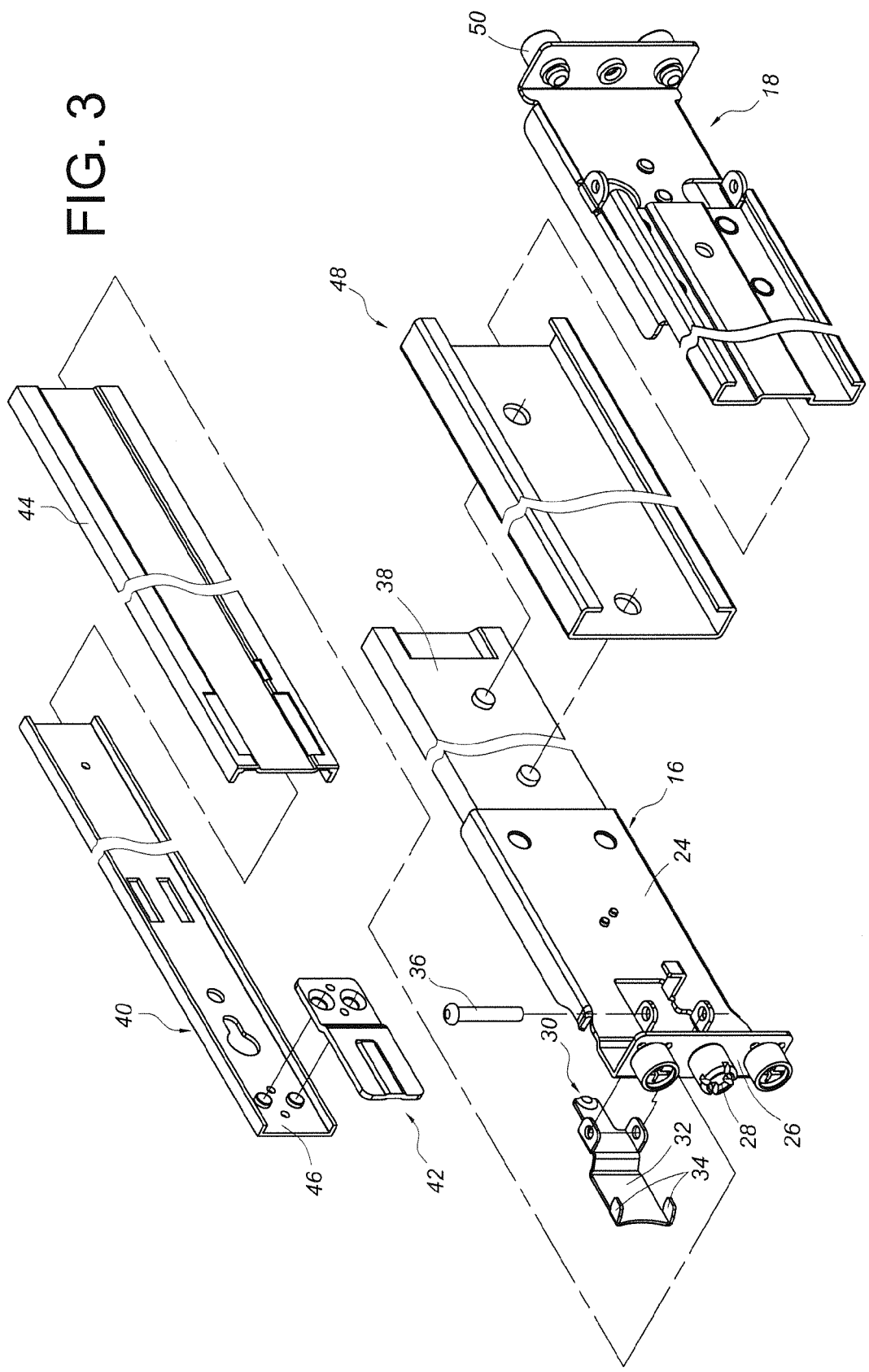
FIG. 3 is an exploded view of the slide rail assembly and brackets in FIG. 2.

In one preferred embodiment as shown in FIG. 2 and FIG. 3, the first bracket 16 includes a side plate 24, an end plate 26 bent from the side plate 24, at least one mounting member 28 connected to the end plate 26, and a movable member 30 movably connected to the side plate 24.

The side plate 24 and the end plate 26 are in a substantially perpendicular arrangement. The at least one mounting member 28 is mounted to the at least one hole 22 of the first post 20a respectively. The movable member 30 has a wall portion 32 and at least one retaining portion 34 bent from the wall portion 32. The at least one retaining portion 34 corresponds to, and is spaced a predetermined distance t away from, the end plate 26 (as can be seen more clearly in FIG. 6A). The wall portion 32 and the at least one retaining portion 34 are in a substantially perpendicular arrangement. The movable member 30 is movably connected to the side plate 24 by a connector 36. For example, the connector 36 pivotally connects the movable member 30 to the side plate 24.

The slide rail assembly 12 includes a first rail 38, a second rail 40, and a retaining member 42. Herein, the slide rail assembly 12 further includes a third rail 44.

The first rail 38 includes an end portion (e.g., a front portion) connected to the side plate 24. The second rail 40 can be displaced longitudinally relative to the first rail 38. Herein, the second rail 40 is longitudinally movably connected to the first rail 38 via the third rail 44. The third rail 44 increases the distance by which the second rail 40 can be pulled out relative to the first rail 38. In another embodiment (not shown), however, the slide rail assembly 12 is a two-rail assembly. That is to say, the slide rail assembly of the present invention is not limited to the three-rail configuration disclosed in the embodiment in discussion.

The retaining member 42 is connected to the second rail 40. Preferably, the second rail 40 includes an end portion 46, and the retaining member 42 is connected by a connecting means to a portion of the second rail 40 that is adjacent to the end portion 46. The connecting means can be riveting, soldering, or other connection methods; the present invention imposes no limitations in this regard.

The second bracket 18 is connected to the opposite end portion (e.g., a rear portion) of the first rail 38 via an auxiliary member 48. Like the first bracket 16, the second bracket 18 includes at least one mounting member 50 to be mounted to the at least one hole 22 of the second post 20b respectively.

It can be known from the above that the slide rail assembly 12 can be mounted to the first post 20a and the second post 20b via the at least one mounting member 28 of the first bracket 16 and the at least one mounting member 50 of the second bracket 18, respectively.

Figure 4A:
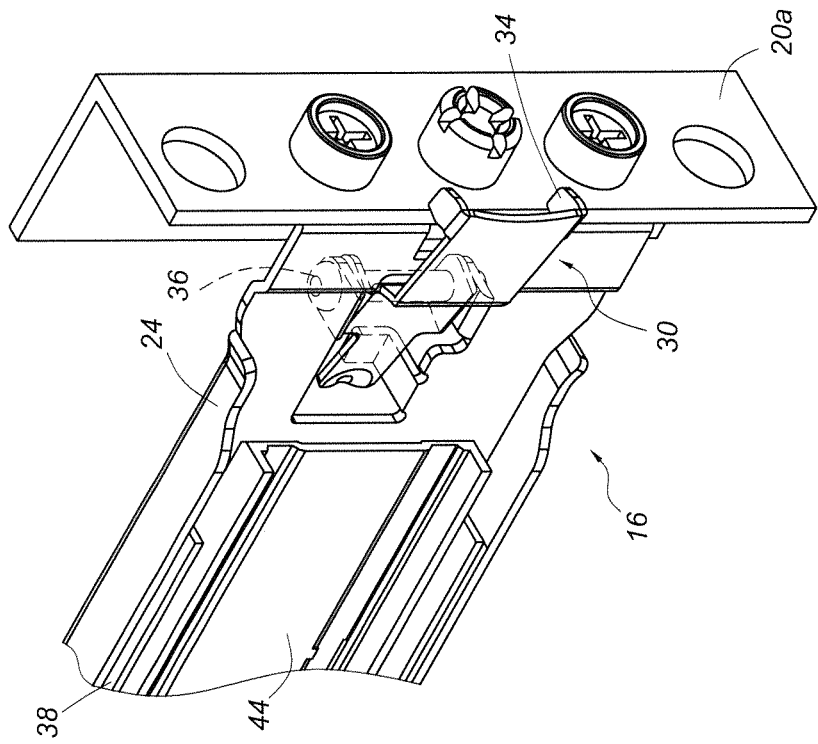
FIG. 4A shows how the first rail and third rail of the slide rail assembly in the first embodiment of the present invention are mounted to a first post via the first bracket and how a movable member can be operated and moved to a closed position.
Figure 4B:
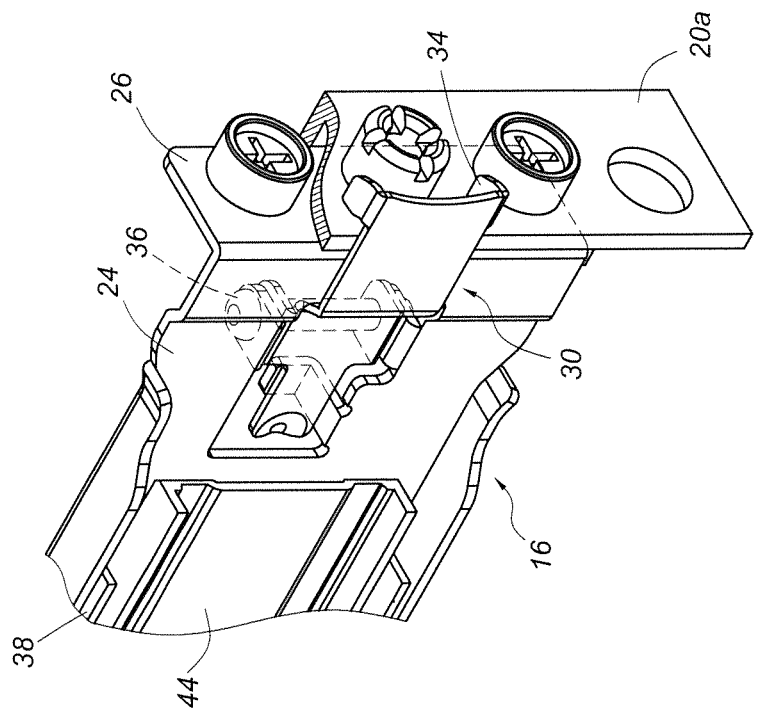
FIG. 4B shows how the first rail and third rail of the slide rail assembly in the first embodiment of the present invention are mounted to the first post via the first bracket and how the movable member can be operated and moved to an opened position.

FIG. 4A and FIG. 4B show how the first rail 38 and the third rail 44, which are longitudinally movably connected to each other, are mounted to the first post 20a via the first bracket 16. In the state shown in FIG. 4A and FIG. 4B, the first post 20a is located within the predetermined distance t (see FIG. 6A), and the at least one retaining portion 34 of the movable member 30 faces the first post 20a longitudinally or is pressed against the first post 20a, thereby preventing the first bracket 16 from falling off from the first post 20a.

Once the first bracket 16 is mounted to the first post 20a, the movable member 30, which is movably connected to the side plate 24 via the connector 36, can be operated relative to the side plate 24 by the operator so as to be moved to a closed position (see FIG. 4A) or an opened position (see FIG. 4B). When the movable member 30 is in the closed position, the at least one retaining portion 34 of the movable member 30 is blocked by the first post 20a (e.g., the at least one retaining portion 34 is blocked at the front end of the first post 20a) to ensure that the first bracket 16 will not fall off from the first post 20a.

Figure 5:
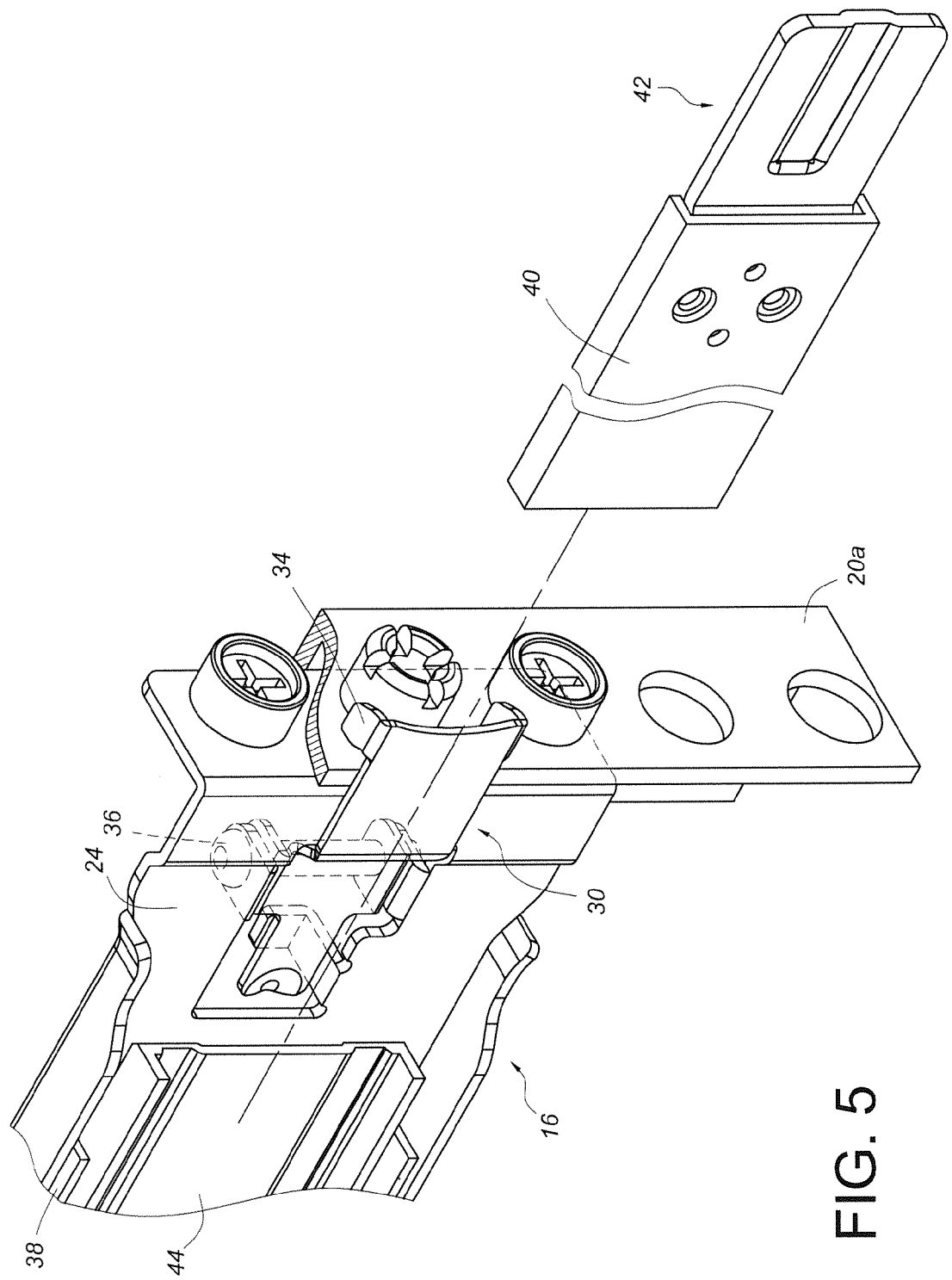
FIG. 5 not only shows how the first rail and third rail of the slide rail assembly in the first embodiment of the present invention are mounted to the first post via the first bracket, but also shows the second rail schematically as separate from the third rail.

However, the movable member 30, which is pivotally connected to the side plate 24 via the connector 36, tends to or is likely to open when subjected to external impact. Should the movable member 30 open by accident, the first post 20a of the rack 14 will have problem blocking the at least one retaining portion 34 of the movable member 30 securely. To prevent such a scenario, the retaining member 42 is provided. Referring to FIG. 5, once the first rail 38 and the third rail 44 are mounted to the first post 20a via the first bracket 16 and the at least one retaining portion 34 of the movable member 30 is blocked by the first post 20a, the retaining member 42 connected to the second rail 40 can restrict or stop lateral movement of the movable member 30, or to be more precise, the retaining member 42 can restrict pivotal movement of the movable member 30.

More specifically, referring to FIG. 5, FIG. 6A, and FIG. 6B, when the second rail 40 has been retracted relative to the first rail 38 (see FIG. 6A, in which the second rail 40 is in a retracted position relative to the first rail 38), at least a portion of the retaining member 42 faces the movable member 30; therefore, by means of the retaining member 42, the second rail 40 can restrict or stop lateral displacement of the movable member 30 relative to the retaining member 42. In other words, the foregoing design can restrict movement of the movable member 30 from the closed position to the opened position, allowing the first post 20a to firmly block the at least one retaining portion 34 of the movable member 30 so that the movable member 30 will not be lifted open (i.e., from the closed position to the opened position) by external impact.

When the second rail 40 is displaced longitudinally relative to the first rail 38 from the retracted position to an extended position (see FIG. 6B), the retaining member 42 is moved along with the second rail 40 to the extended position. When the second rail 40 is displaced longitudinally relative to the first rail 38 from the extended position to the retracted position (see FIG. 6A), the retaining member 42 is moved back to the retracted position along with the second rail 40. As such, the retaining member 42 will not interfere with relative displacement of the rails during extension or retraction.

Figure 7:
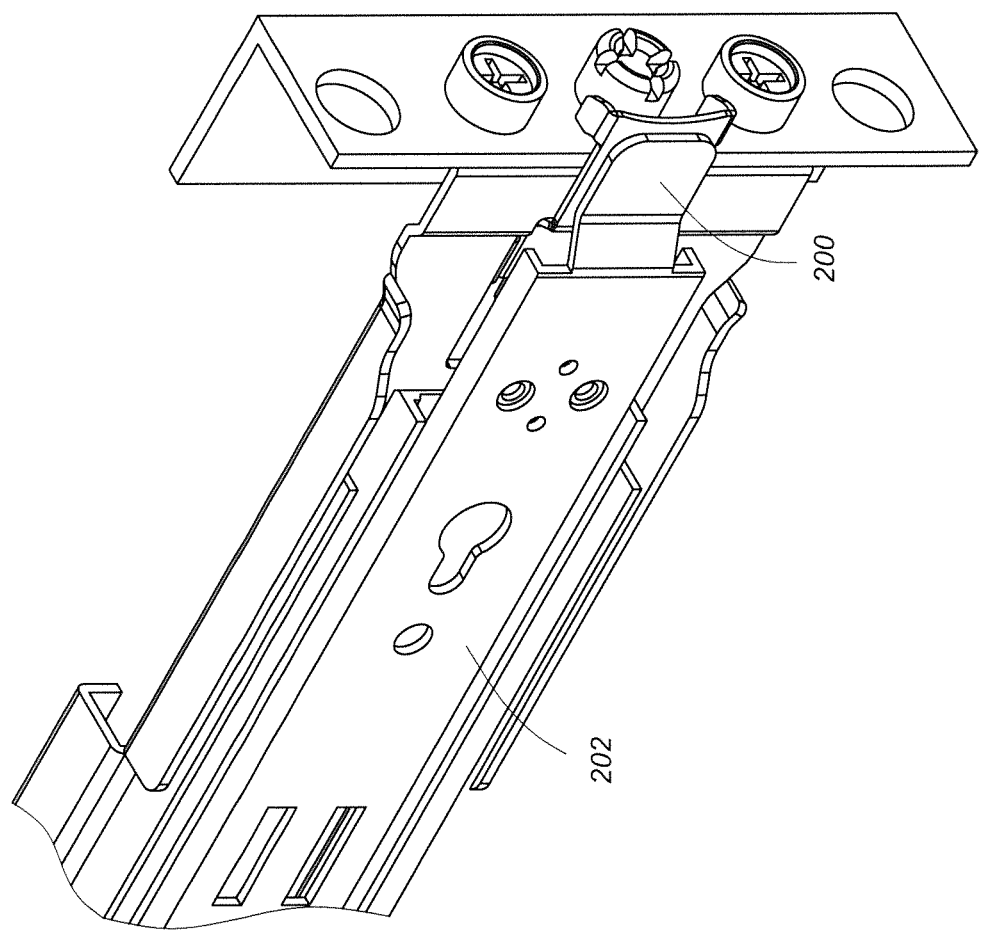
FIG. 7 schematically shows how the retaining member in the second embodiment of the present invention is integrally formed with the second rail.

FIG. 7 shows the second embodiment of the present invention, in which the retaining member 200 is integrally formed with the second rail 202. For example, the retaining member 200 is integrally formed with the second rail 202 at a position adjacent to an end portion of the second rail 202.

Figure 8:
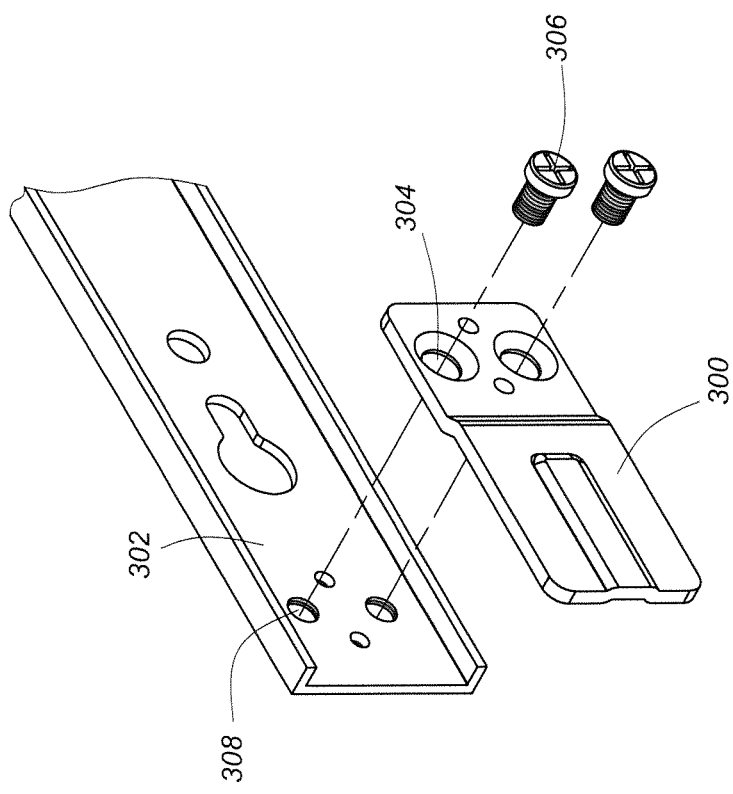
FIG. 8 schematically shows how the retaining member in the third embodiment of the present invention is assembled to and thereby connected to the second rail.

FIG. 8 shows the third embodiment of the present invention, in which the retaining member 300 and the second rail 302 have an assembly portion 304 and an assembly portion 308 respectively so that the retaining member 300 and the second rail 304 can be connected together by assembly. For example, the retaining member 300 has at least one assembly portion 304 which can be connected to the at least one assembly portion 308 of the second rail 302 via at least one assembly member 306 respectively. Thus, the retaining member 300 can be assembled to or detached from the second rail 302 with ease.

Figure 9:
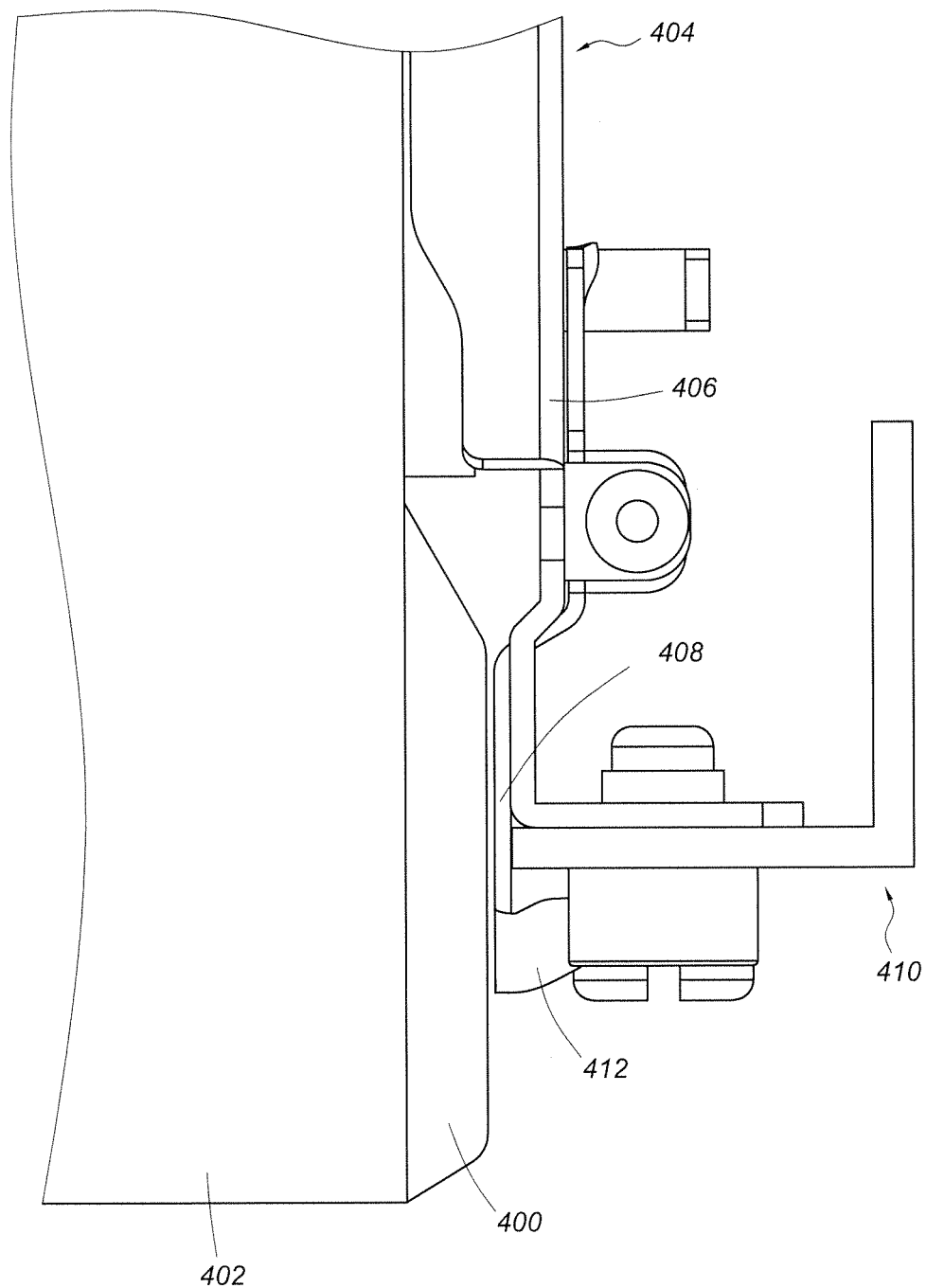
FIG. 9 schematically shows how the retaining member and movable member in the fourth embodiment of the present invention are arranged relative to each other.

FIG. 9 shows the fourth embodiment of the present invention, in which the retaining member 400 is provided on a chassis 402. The retaining member 400 is implemented as a stud, a projecting block, or a like protuberance formed by the chassis 402 or is mounted to the chassis 402 by an attaching means; the present invention has no limitations in this respect. Generally, the chassis 402 is mounted between a pair of slide rail assemblies 404, though only one of the slide rail assemblies 404 is depicted in FIG. 9. As shown in the drawing, the slide rail assembly 404 includes a bracket 406 (first bracket) and a movable member 408 movably (e.g., pivotally) connected to the bracket 406. The slide rail assembly 404 is mounted to a rack 410 via the bracket 406. The movable member 408 has at least one retaining portion 412 to be blocked by or pressed against the rack 410 so as to ensure that the slide rail assembly 404 is firmly and safely mounted to the rack 410. When the chassis 402 has been displaced via the slide rail assembly 404 to a retracted position relative to the rack 410, at least a portion of the retaining member 400 corresponds to the movable member 408 and can thereby restrict or stop lateral displacement of the movable member 408 relative to the retaining member 400.

This mode of implementation, therefore, is equally capable of ensuring that the movable member 408 stays in the predetermined working state. In other words, should improper application of force result in collision or shocks when the chassis 402 is pushed and retracted into the rack 410, the aforesaid arrangement of the retaining member 400 guarantees that the movable member 408 will not disengage from the rack 410.

While the present invention has been disclosed via the foregoing preferred embodiments, it is understood that those embodiments are not intended to be restrictive of the present invention. The scope of patent protection, if granted, is defined by the appended claims.

The invention claimed is:

1. A slide rail assembly coupled to a rack, comprising:
   a first rail;
   a second rail longitudinally displaceable between a retracted and extended positions relative to the first rail;
   a retaining member connected to the second rail;
   a bracket coupled to the first rail, the bracket including a side plate, and an end plate; and
   a movable member movably connected to the side plate, the movable member in a locking position maintaining the bracket coupled to the rack;
   wherein the side plate and the end plate of the bracket are in a substantially perpendicular arrangement, the side plate is connected to the first rail, and the movable member has at least one retaining portion extending transversely relative to a longitudinally extending wall portion thereof to be spaced from the end plate by a predetermined distance when in the locking position;
   wherein when the second rail is in the retracted position relative to the first rail, at least a portion of the retaining member abuts the wall portion of the movable member to block lateral displacement of the at least one retaining portion of the movable member away from the bracket the and rack.

2. The slide rail assembly of claim 1, wherein the retaining member is integrally formed with the second rail.

3. The slide rail assembly of claim 1, wherein at least one connecting member connects the retaining member to the second rail.

4. The slide rail assembly of claim 1, wherein each of the retaining member and the second rail has an assembly portion allowing the retaining member and the second rail to connect with each other.

5. The slide rail assembly of claim 1, wherein the movable member is pivotally connected to the side plate by a connector.

6. A slide rail assembly mounted to a rack by at least one bracket for mounting a chassis to the rack, the slide rail assembly comprising:
- a first rail connected to the at least one bracket;
- a second rail longitudinally displaceable between a retracted and extended positions relative to the first rail, the chassis being mounted to the second rail;
- a retaining member connected to the second rail; and
- a movable member movably connected to the at least one bracket, the movable member having a retaining portion at an end portion thereof, the movable member being movable between a closed position and an opened position, the retaining portion extending transversely relative to a longitudinally extending wall portion thereof to be spaced from an end segment of the at least one bracket when the movable member has been operated and thereby moved to the closed position;
- wherein when the second rail is retracted relative to the first rail, at least a portion of the retaining member is disposed laterally adjacent the wall portion of the movable member to block the retaining portion of the movable member from moving laterally away from the closed position to the opened position.

7. The slide rail assembly of claim 6, wherein the retaining member is integrally formed with the second rail.

8. The slide rail assembly of claim 6, wherein at least one connecting member connects the retaining member to the second rail.

9. The slide rail assembly of claim 6, wherein the retaining member and the second rail have corresponding assembly portions allowing the retaining member and the second rail to connect with each other.

10. The slide rail assembly of claim 6, wherein the movable member is pivotally connected to the side plate by a connector.

11. The slide rail assembly of claim 6, wherein the retaining member is mounted to the chassis and connected to the second rail via the chassis.

12. A slide rail assembly coupled to a rack, comprising:
- a first rail;
- a second rail longitudinally displaceable between a retracted and extended positions relative to the first rail;
- a retaining member connected to the second rail;
- a bracket including a side plate connected to the first rail, and an end plate extending transversely with respect to the side plate; and
- a movable member movably connected to the side plate, wherein the movable member has a retaining portion at an end portion thereof and is movable between a closed position and an opened position, and the retaining portion extending transversely relative to a longitudinally extending wall portion thereof to be spaced from the end plate when the movable member has been operated and thereby moved to the closed position;
- wherein when the second rail is retracted relative to the first rail, at least a portion of the retaining member is disposed laterally adjacent the wall portion of the movable member to block the retaining portion of the movable member from moving laterally away from the closed position to the opened position.

13. The slide rail assembly of claim 12, wherein the retaining member is integrally formed with the second rail.

14. The slide rail assembly of claim 12, wherein at least one connecting member connects the retaining member to the second rail.

15. The slide rail assembly of claim 12, wherein each of the retaining member and the second rail has an assembly portion allowing the retaining member and the second rail to connect with each other.

16. The slide rail assembly of claim 12, wherein the movable member is pivotally connected to the side plate by a connector.

* * * * *